(12) United States Patent
Munakata et al.

(10) Patent No.: US 6,806,206 B2
(45) Date of Patent: Oct. 19, 2004

(54) ETCHING METHOD AND ETCHING LIQUID

(75) Inventors: Masaki Munakata, Kanagawa (JP);
Hirohito Komatsu, Kanagawa (JP);
Satoshi Kumon, Kanagawa (JP);
Kazuma Teramoto, Aichi (JP);
Nobuhiro Goda, Aichi (JP); Masakazu Motoi, Aichi (JP); Noriyuki Saitou, Fukuoka (JP); Toshiaki Sakakihara, Fukuoka (JP); Makoto Ishikawa, Fukuoka (JP)

(73) Assignees: Sony Corporation, Tokyo (JP); St Liquid Crystal Display Corporation, Aichi (JP); Mitsubishi Chemical Corporation, Tokyo (JP)

( * ) Notice: Subject to any disclaimer, the term of this patent is extended or adjusted under 35 U.S.C. 154(b) by 49 days.

(21) Appl. No.: 10/197,259

(22) Filed: Jul. 18, 2002

(65) Prior Publication Data
US 2003/0022518 A1 Jan. 30, 2003

(30) Foreign Application Priority Data

Jul. 23, 2001 (JP) ........................................ 2001-221377
Mar. 29, 2002 (JP) ........................................ 2001-096202

(51) Int. Cl.$^7$ ............................................. H01L 21/302
(52) U.S. Cl. ......................... 438/745; 438/754; 438/689
(58) Field of Search ........................................... 438/745

(56) References Cited

U.S. PATENT DOCUMENTS 4,784,785 A  * 11/1988  Cordani et al. ............ 252/79.4
4,859,281 A  *  8/1989  Goltz ........................... 156/666
5,314,772 A  *  5/1994  Kozicki et al. ............... 430/14

FOREIGN PATENT DOCUMENTS

JP           9-208267          8/1997

* cited by examiner

*Primary Examiner*—David Nelms
*Assistant Examiner*—Thao p. le
(74) *Attorney, Agent, or Firm*—Manabu Kanesaka

(57) ABSTRACT

A silver or silver alloy thin layer on a substrate is etched by an etching liquid uniformly without producing an etching residue while avoiding side etching due to over etching. The etching liquid contains silver ions in a range from 0.005 to 1 weight %. The etching liquid is fed to a tank or an etching liquid feeding apparatus, and then brought into contact with the silver or silver alloy thin layer on the substrate.

12 Claims, No Drawings

ETCHING METHOD AND ETCHING LIQUID

BACKGROUND OF THE INVENTION

The present invention relates to an etching method and etching liquid which are suitable for forming minute wiring of silver or silver alloy for a semiconductor device, a liquid crystal display, an IC card and so on.

Electrode wiring in a semiconductor or a liquid crystal display has been processed minutely increasingly. As an electrode wiring material, silver and silver alloy having a high index of reflection and low electrical resistance have been used widely.

Silver and silver alloy have an index of reflection higher than that of aluminum and aluminum alloy and are thus widely used as the reflecting electrode wiring materials for semiconductors, liquid crystal displays, and solar cells. To form electrode wiring made of silver or silver alloy, silver or silver alloy is processed into a predetermined pattern. Examples of a method for forming the pattern are a wet etching method using chemicals and a dry etching method such as ion etching and plasma etching.

The wet etching can be conducted less expensively with using cheap chemicals and without an expensive apparatus than the dry etching. According to the wet etching method, a metal material having various kinds of outer profile can be processed, and a material having a three dimensional structure can be processed. The wet etching has still another advantage that silver, silver alloy and compounds thereof can be easily recovered from etching waste liquid, and the wet etching has been widely conducted.

A known etching liquid for silver or silver alloy includes an iron nitrate solution, a solution containing iodine and iodine compound, a solution containing hydrogen peroxide and ammonia, and a solution containing nitric acid. Among these etching liquids, the solution containing nitric acid is well reactable to silver or silver alloy so as to provide higher etching speed, and the solution is easy to be handled.

These etching liquids are also used for forming a pattern formed by using photolithographic technique for fine electrode wiring made of silver or silver alloy for semiconductors and liquid crystal displays.

An etching liquid described in Japanese patent publication H9-208267A contains hydrochloric acid and a surfactant in order to remove silver or silver alloy residue which is hardly dissolved and to prevent such residue from adhering to a surface of a substrate again.

A substrate for a liquid crystal display is manufactured by a process including a step of forming a silver or silver alloy thin layer having a predetermined thickness on a main surface of a glass substrate by a sputtering method; a step of forming a resist resin layer for forming a fine electrode pattern or wiring pattern by using photolithographic technique; a step of removing the silver or silver alloy thin layer which is not covered with the resist resin layer by wet etching method; and a step of removing the resist resin layer.

In the etching step of removing the silver or silver alloy thin layer having the fine pattern by the photolithographic technique, the silver or silver alloy should be etched uniformly without producing etching residue of the silver or silver alloy, while preventing etching excessively a side periphery of the silver or silver alloy layer covered with the resist resin layer. Etching the side periphery is called as "side etching".

However, according to conventional wet etching technique, silver or silver alloy is easily left at portions where a vertical line and a lateral line formed by etching cross, that is, narrow portions surrounded by silver or silver alloy layer and resist resin layers. This means that etching residues are easily produced there. To avoid this problem, the etching process is continuously conducted until no residue exists. This leads to "over etching" where the silver or silver alloy is etched for a longer period of time to manufacture the wiring having the predetermined width. Namely, "over etching" is conducted. Although the over etching prevents the residue, it proceeds the side etching of the silver or silver alloy thin layer, thus leading to uneven etching.

SUMMARY OF THE INVENTION

In the etching method of the present invention, a silver or silver alloy thin layer on a substrate surface is etched by steps of supplying an etching liquid into an etching tank or an etching liquid feeding apparatus, wherein the etching liquid contains silver ions in a range from 0.005 to 1 weight %, and contacting the layer with the etching liquid.

The etching liquid for silver or silver alloy of the present invention can contain at least phosphoric acid, nitric acid, acetic acid, and silver ion, wherein the silver ion concentration is in a range from 0.005 to 1 weight % and the acetic acid concentration is 1 weight % or more.

According to the present invention, in wet etching for a sliver or silver alloy thin layer, the residue of silver or silver alloy is prevented and the side etching due to over etching is also prevented. In addition, even and stable etching can be conducted.

It is well known in the art that when ions of a metal as the etching subject exist in etching liquid, acid components for dissolution (e.g. phosphoric acid, acetic acid) and oxidant components (e.g. nitric acid) in the etching liquid are consumed, thus lowering the etching rate. Accordingly, the conventional etching liquid contains no ion of a metal as the etching subject when the etching liquid is used at the start of etching (i.e. the etching liquid is fresh). In addition, the used etching liquid is normally discarded because the metal ion therein is hardly removed.

In contrast, the etching liquid of the invention contains silver ions in an amount from 0.005 to 1 weight % even when it is fresh. In addition, during etching, the silver ion concentration in the etching liquid is always kept preferably in a range from 0.005 to 1 weight %, thereby preventing residue of silver or silver alloy at etched portions and excessive side etching due to over etching. Therefore, uniform and stable etching can be conducted.

The etching method of the present invention has supreme effects in etching for forming reflecting electrode wiring of a semiconductor, a liquid crystal display, a solar cell, or the like. The method can be applied effectively to etch silver or silver alloy portions on the substrate for a fine wiring range which is uncovered with the resist while most of the substrate surface is covered with the resist resin layer. The silver or silver alloy can be etched uniformly without the side etching, without leaving residues in the fine wiring range, and without over etching.

The silver ion concentration in the etching liquid is always kept in a range from 0.005 to 1 weight % by holding the etching liquid having a silver ion concentration in a range from 0.005 to 1 weight % in a tank or an etching liquid feeding apparatus and bringing the liquid into contact with the silver or silver alloy layer on the substrate when the etching process is started. The liquid is also kept its silver ion concentration in the above range during the substrate is immersed in the liquid, so that the liquid having the ion concentration of the above range is always made contact with the silver or silver alloy thin layer.

DETAILED DESCRIPTION OF PREFERRED EMBODIMENTS

Hereinafter, the etching method and etching liquid of the present invention will be described in detail.

The etching liquid used in the etching method of the present invention always contains silver ions at a concentration of 0.005 weight % (50 weight ppm) to 1 weight %. The silver ion concentration in the etching liquid is preferably 0.02 weight % (200 weight ppm) or more and preferably 0.5 weight % (5000 weight ppm) or less.

Too low silver ion concentration in the etching liquid may cause etching residues at etched portions. On the other hand, too high silver ion concentration may increase the degree of side etching and is disadvantageous from the economic point of view because a large amount of expensive silver should be consumed.

The etching liquid having the above silver ion concentration is prepared by adding a predetermined amount of silver or silver compound to an ordinary etching liquid for silver or silver alloy. Examples of the method of adding silver or silver compound include a method of directly adding and dissolving silver or silver compound into the etching liquid, a method of adding a silver solution in which silver or silver compound is dissolved in an acid solution for composing the etching liquid, and a method of adding a silver aqueous solution in which silver compound is dissolved in water to the etching liquid.

Silver used as a silver ion source may be pure silver and a silver compound. Examples of the inorganic silver compounds are silver salts of inorganic acid such as silver nitrate, silver nitrite, silver phosphate, silver hexafluorophosphate, silver tetrafluoroborate, silver sulfate, silver chlorate, silver perchlorate, and silver iodate, silver bromide, silver chloride, silver oxide, and silver sulfide. Examples of the organic silver compounds are silver salts of organic acid such as silver acetate, silver benzoate, silver thiocyanate, silver p-toluenesulfonate, silver trifluoroacetate, and silver trifluoromethanesulfonate, and silver cyanide.

The silver or silver compound is preferably dissolved homogeneously in the etching liquid to exist as silver ion in the etching liquid. Accordingly, the silver ion source should be selected from the above referring to solubility thereof to the etching liquid. These silver ion sources may be used alone or in combination. The silver ion source is preferably silver powder or silver sand having purity of 99% or more.

The etching liquid containing the silver ion in the above range of concentration may further contain other components such as nitric acid. The etching liquid contains preferably nitric acid and acetic acid, and more preferably phosphoric acid, nitric acid, and acetic acid.

The nitric acid concentration in the etching liquid can be 0.1 weight % or more, preferably 0.25 weight % or more, and 15 weight % or less, preferably 10 weight % or less. The etching liquid having too high nitric acid concentration may damage the resist resin layer. On the other hand, the liquid of too low nitric acid concentration may lower the etching rate.

The phosphoric acid concentration in the etching liquid can be 10 weight % or more, preferably 20 weight % or more, and 80 weight % or less, preferably 70 weight % or less. Too high phosphoric acid concentration increases the viscosity of the etching liquid, leading trouble in spraying. On the other hand, too low phosphoric acid concentration significantly lowers the etching rate.

The acetic acid concentration in the etching liquid can be 1 weight % or more, preferably 5 weight % or more, more preferably 10 weight % or more, most preferably 15 weight % or more, and 50 weight % or less, preferably 40 weight % or less, most preferably 35 weight % or less. Too high acetic acid concentration may change the composition of the etching liquid remarkably due to the evaporation of acetic acid, thus shortening the etching liquid life time. On the other hand, too low acetic acid concentration reduces the wettability of the etching liquid to the resist resin layer, thus easily causing incomplete etching.

When most of the surface of the substrate is covered with the resist resin layer so that only a very narrow region is uncovered with the resin layer and linear silver or silver alloy is exposed therein, the etching liquid is preferable to always contain the acetic acid of 1 weight % or more to etch the linear silver or silver alloy. The etching liquid containing acetic acid of 1% or more can be improved in its wettability to the resist resin layer, thus facilitating permeation thereof into minute portions of fine wiring of silver or silver alloy, so that the silver or silver alloy can be etched even at minute portions without residue or without over etching, thereby achieving uniform etching without the side etching.

The etching liquid containing phosphoric acid, nitric acid, acetic acid, and silver ion can contain water. The water concentration may be 5 weight % or more, preferably 7.5 weight % or more, and 50 weight % or less, preferably 40 weight % or less.

The composition of the etching liquid can be determined according to the required etching rate and etching area ratio which is a ratio of the area of silver or silver alloy to be etched to the area covered with the resist resin layer.

The etching liquid may contain at least one additive for improving its characteristics such as a surfactant. The surfactant can be an anionic surfactant, a cationic surfactant, an ampholytic surfactant, or a nonionic surfactant. The surfactant concentration in the etching liquid can be from 0.001 to 1 weight %, preferably 0.005 to 0.1 weight %.

Fine particles existing in the etching liquid are preferably previously removed such that the number of fine particles having a particle diameter of 0.5 $\mu$m or more become 1000/mL or less because such particles may trouble the uniform etching for fine etching pattern. Such fine particles in the etching liquid can be removed by filtering the etching liquid with a microfiltration membrane filter. The filtering method may be a one-path type, but a circulating type is more preferable since it removes the particles at a high rate.

The pore size of the membrane filter for removing the fine particles is preferably 0.2 $\mu$m or less. The material of filter may be high density polyethylene, fluoroplastic type materials such as polytetrafluoroethylene, or the like.

The etching method and the etching liquid of the present invention are suitable for manufacturing a substrate of a liquid crystal display having a silver or silver alloy thin layer on its substrate. According to the present invention, a fine electrode wiring pattern can be uniformly etched with high precision.

The silver or silver alloy thin layer has usually a thickness of 1 $\mu$m or less, preferably 0.5 $\mu$m or less. The thickness of an ordinary silver or silver alloy thin layer is 0.1 $\mu$m or more.

The fresh etching liquid containing silver ion of 0.005 to 1 wt. % can be held in an etching tank or an etching liquid feeding apparatus, and the etching liquid can be brought into contact with the silver or silver alloy thin layer on the substrate when an etching step is started.

Various kinds of method can be employed wherein a semiconductor substrate having the silver or silver alloy thin layer on its surface is brought into contact with the etching liquid. The method includes spraying method wherein the etching liquid is sprayed to the surface of the substrate in the vertical direction, an immersing method wherein the substrate is immersed in the etching liquid. In addition, the operating conditions are not particularly limited.

In the spraying method, the amount and the pressure of etching liquid to be applied onto the substrate may be determined according to the distance between the substrate and a spray nozzle and characteristics including viscosity of the etching liquid. The distance between the substrate surface and the spray nozzle may be in a range from 50 to 150 mm and the spraying pressure of the etching liquid may be in a range from 0.01 to 0.5 MPa, preferably from 0.05 to 0.2 MPa.

When etching the silver or silver alloy thin layer, the etching liquid may have an ordinary etching temperature range, that is, from 20 to 50° C. A lower temperature range in the ordinary temperature range is preferable so that the temperature is preferably from 20 to 40° C., more preferably from 25 to 35° C., most preferably from 25 to 30° C.

The silver ion concentration in the etching liquid is always kept in a range from 0.005 to 1 weight %. During the etching process, the silver ion concentration in the etching liquid increases because the silver or silver alloy layer is etched. In this case, to prevent the silver ion concentration from exceeding the suitable range, the silver ion concentration in the etching liquid is measured and, if necessary, is controlled by taking out a part of the etching liquid and adding fresh etching liquid which contains no silver ion. It is preferable to further control the concentrations of other components including phosphoric acid, nitric acid, and acetic acid by adding them.

In the present invention, used etching liquid can be recycled by controlling the silver ion concentration and concentrations of other components in the etching liquid. With this etching liquid, silver or silver alloy can be etched not to be left at minute portions, and excessive side etching can be avoided without undesirable over etching, thereby achieving uniform stable etching.

EXAMPLES AND COMPARATIVE EXAMPLES

Hereinafter, the present invention will be explained with concrete examples and comparative examples. It should be noted that the present invention is not limited to the following examples.

Examples 1 through 10 and Comparative Examples 1 through 3

A silver layer having a thickness of 0.2 μm was formed as a metal thin layer on a glass substrate by a spattering method, and a positive type photoresist layer having a thickness of 1.2 μm was further formed thereon by a spin coating method. Linear lines which elongate both vertically and laterally were formed on the photoresist layer by removing the photoresist with employing photolithography technique. The vertical lines have a width of 5 μm and are spaced from each other by 70 μm. The lateral lines have a width of 5 μm, and are spaced from each other by 200 μm.

The substrate was cut into pieces of about 10 mm in width and 50 mm in length. The pieces were used as test pieces for the following etching tests:

Phosphoric acid (85 weight %), nitric acid (70 weight %), and acetic acid (glacial acetic acid), silver (99% pure silver powder), and pure water were mixed to prepare etching liquids, the composition of which are shown in Table 1. Each etching liquid of 200g held in a beaker of 200 cc was controlled the temperature thereof to be 30° C. The above test piece was dipped in each etching liquid in the beaker and was etched by moving the test pieces vertically and laterally for 60 seconds, during which the test piece did not suffer over etching. Then, each test piece was taken out, washed by ultra pure water (Milli-QSP: available from Nihon Millipore Corporation) for one minute and, after that, dried by clean air.

The surface of each substrate was observed at its etched portions of 5 μm in width where silver should be etched with a laser microscope (VK-8500, available from Keyence Corporation) at about ×1000 magnification. The observation was conducted at randomly selected 200 portions. Portions without silver residue were considered to be of the passing grade. The evaluation was made based on the ratio of portions of the passing grade (the pass rate). The results are shown in Table 1.

In any of the examples and the comparative examples, the increase in silver ion concentration in the etching liquid due to the etching was a trace amount, i.e. about 2 wt. ppm.

TABLE 1

| | Composition of etching liquid | | | | | |
|---|---|---|---|---|---|---|
| | Phosphoric acid (wt. %) | Nitric acid (wt. %) | Acetic acid (wt. %) | Water (wt. %) | Silver ion (wt. ppm) | Pass rate (%) |
| Example | | | | | | |
| 1 | 62.8 | 2.7 | 6.4 | 28.1 | 200 | 96 |
| 2 | 62.8 | 2.7 | 6.4 | 28.1 | 500 | 99 |
| 3 | 62.8 | 2.7 | 6.4 | 28.1 | 1000 | 99 |
| 4 | 62.8 | 2.7 | 6.4 | 28.1 | 2000 | 99 |
| 5 | 46 | 4.9 | 25.4 | 23.7 | 50 | 97 |
| 6 | 46 | 4.9 | 25.4 | 23.7 | 200 | 99 |
| 7 | 46 | 4.9 | 25.4 | 23.7 | 500 | 99 |
| 8 | 46 | 4.9 | 25.4 | 23.7 | 1000 | 99 |
| 9 | 46 | 4.9 | 25.4 | 23.7 | 2000 | 99 |
| 10 | 65.8 | 2.4 | 2.1 | 29.7 | 200 | 94 |
| Comparative Example | | | | | | |
| 1 | 62.8 | 2.7 | 6.4 | 28.1 | 0 | 90 |
| 2 | 46 | 4.9 | 25.4 | 23.7 | 0 | 92 |
| 3 | 65.8 | 2.4 | 2.1 | 29.7 | 0 | 88 |

As apparent from Table 1, the number of portions with residue was increased when the etching was conducted in such a manner not to cause over etching in the comparative examples. On the other hand, in the examples of the invention, the residue was not produced for the etching time which was short enough not to cause over etching, and no side etching occurred.

It was found from Examples 1 and 5 that the etching was conducted effectively even at a low concentration of silver ion in the etching liquid when the etching liquid contained the acetic acid in a range from 15 to 35 weight % (25.4 weight % in Table 1).

As described above, the etching method and the etching liquid of the present invention can inhibit the generation of silver or silver alloy residues without over etching and thus can prevent uneven etching due to the side etching. Therefore, according to the present invention, uniform and stable minute works for forming fine wiring of a silver or silver alloy thin layer are achieved with high precision in a short time.

What we claim is:

1. An etching method for etching a silver or silver alloy thin layer on a substrate, comprising the steps of:
    preparing initially an etching liquid containing silver ions in a range from 0.005 to 1 weight %,
    supplying the etching liquid into an etching tank or an etching liquid feeding apparatus, and
    contacting said thin layer with the etching liquid for etching.

2. An etching method as claimed in claim 1, further comprising the step of maintaining concentration of the silver ions in the etching liquid in a range from 0.005 to 1 weight % during the etching.

3. An etching method as claimed in claim 1, wherein the etching liquid contains phosphoric acid, nitric acid, and acetic acid.

4. An etching method as claimed in claim 3, wherein the etching liquid contains the acetic acid at 1 weight % or more.

5. An etching method as claimed in claim 3, wherein the etching liquid contains the phosphoric acid in a range from 10 to 80 weight % and the nitric acid in a range from 0.1 to 15 weight %.

6. An etching method as claimed in claim 1, wherein the etching liquid has a temperature of 35° C. or lower.

7. An etching liquid for etching silver or its alloy, containing silver ions in a range from 0.005 to 1 weight % before etching the silver or its alloy.

8. An etching liquid as claimed in claim 7, wherein said etching liquid further contains phosphoric acid and nitric acid.

9. An etching liquid as claimed in claim 8, wherein said etching liquid further contains acetic acid.

10. An etching liquid as claimed in claim 9, wherein said etching liquid contains the acetic acid at 1 weight % or more.

11. An etching liquid as claimed in claim 8, wherein said etching liquid contains the phosphoric acid in a range from 10 to 80 weight % and the nitric acid in a range from 0.1 to 15 weight %.

12. An etching liquid as claimed in claim 7, wherein said etching liquid contains the silver ions in the range from 0.005 to 1 weight % during etching.

* * * * *